United States Patent

Pancholy et al.

Patent Number: 6,069,839
Date of Patent: May 30, 2000

[54] CIRCUIT AND METHOD FOR IMPLEMENTING SINGLE-CYCLE READ/WRITE OPERATION(S), AND RANDOM ACCESS MEMORY INCLUDING THE CIRCUIT AND/OR PRACTICING THE METHOD

[75] Inventors: Ashish Pancholy, Milpitas; Cathal G. Phelan, Mountain View; Simon J. Lovett, Milpitas, all of Calif.

[73] Assignee: Cypress Semiconductor Corp., San Jose, Calif.

[21] Appl. No.: 09/238,270

[22] Filed: Jan. 27, 1999

Related U.S. Application Data

[60] Provisional application No. 60/078,718, Mar. 20, 1998.
[51] Int. Cl.$^7$ ......................................... G11C 8/00
[52] U.S. Cl. ........................ 365/233; 365/189.04
[58] Field of Search ............................. 365/189.04, 233

[56] References Cited

U.S. PATENT DOCUMENTS 5,530,673   6/1996   Tobita et al. ..................... 365/185.09

*Primary Examiner*—Trong Phan
*Assistant Examiner*—M. Tran
*Attorney, Agent, or Firm*—Christopher P. Maiorana, P.C.

[57] ABSTRACT

A circuit including an address bus providing random addresses for a random access memory array, and a register configured to receive, store or transfer (i) a first random address from the address bus in response to a first periodic signal transition and (ii) a second random address from the address bus in response to a second periodic signal transition, wherein the first and second periodic signal transitions occur within a single periodic signal cycle, and are preferably complementary to each other. In a further embodiment, the invention concerns a random access memory having an address bus providing random address information for a random access memory array, a predecoder configured to at least partially decode the random address information from the address bus, a register configured to receive, store or transfer (i) a first at least partially decoded random address from the address bus in response to a first periodic signal transition and (ii) a second at least partially decoded random address from the address bus in response to a second periodic signal transition, wherein the first and second periodic signal transitions occur within a single periodic signal cycle; and a postdecoder configured to activate the random addresses in the random access memory in response to receiving the random addresses from the register.

22 Claims, 8 Drawing Sheets

6,069,839

CIRCUIT AND METHOD FOR IMPLEMENTING SINGLE-CYCLE READ/WRITE OPERATION(S), AND RANDOM ACCESS MEMORY INCLUDING THE CIRCUIT AND/OR PRACTICING THE METHOD

This application claims the benefit of U.S. Provisional application Ser. No. 60/078,718, filed Mar. 20, 1998.

The invention described and claimed in this application may be related to subject matter described in one or more copending provisional applications entitled, "Random Access Memory And Process For Writing To And Reading From The Same," by Mathew R. Arcoleo, Cathal G. Phelan, Ashish Pancholy, and Simon J. Lovett, identified as Attorney Docket No. CD98022, and/or "Random Access Memory Having Read/Write Address Bus and Process For Writing To And Reading From The Same," by Mathew R. Arcoleo, Cathal G. Phelan, Ashish Pancholy, and Simon J. Lovett, identified as Attorney Docket No. CD98023, both of which were filed in the U.S. Patent and Trademark Office as a provisional patent application on Mar. 13, 1998, both of which are incorporated herein by reference in their entireties.

BACKGROUND OF THE INVENTION

This invention relates generally to the field of semiconductor and/or integrated circuit devices, particularly to a random access memory and process for writing to and reading from the same, and more particularly to a circuit and method for implementing single-cycle read/write operation(s) in a random access memory (RAM).

OBJECTS OF THE INVENTION

The primary object of the invention is to provide a circuit and method that enables reading from and writing to a random access memory in the same clock cycle.

Another object of the invention is to provide a circuit and method that enables reading from and writing to a random access memory in the same clock cycle, using a single read/write address bus or separate read and write address busses.

A further object of the invention is to provide a circuit that latches a new address on each edge, transition or level of a periodic and/or control signal.

A further object of the invention is to provide a random access memory that increases data throughput.

Still yet another object of the invention is to provide such a circuit and/or random access memory that reduces the chip area dedicated to transmitting and/or storing address information.

An even further object of the invention is to provide a random access memory and method of operating the same in which read and write operations may be executed in the same clock cycle.

Yet further objects of the invention include providing such a random access memory and method of operating the same in which fully random addresses may be employed, in which successive and/or asserted addresses may be completely unrelated, and/or in which no restrictions are placed on successive and/or asserted addresses.

Another object of the invention is to provide such a random access memory and method of operating the same in which the same address may be used to read from and write to the memory in the same clock cycle.

A further object of the invention is to provide such a random access memory and method of operating the same in which a periodic signal (e.g., a clock) is the only control-type signal essential to operability.

Other objects and advantages of the present invention will become apparent from the following description, taken in connection with the accompanying drawings, wherein, by way of illustration and example, embodiments of the present invention are disclosed.

SUMMARY OF THE INVENTION

The present invention concerns a circuit comprising an address bus providing random addresses for a random access memory array, and a register configured to store or receive (i) a first random address from the address bus to the random access memory array directly or indirectly in response to a first periodic signal transition and (ii) a second random address from the address bus to the random access memory array directly or indirectly in response to a second periodic signal transition, wherein the second periodic signal transition occurs in the same periodic signal cycle as, and preferably is complementary to, the first periodic signal transition.

BRIEF DESCRIPTION OF THE DRAWINGS

The drawings constitute a part of this specification and include exemplary embodiments to the invention, which may be embodied in various forms. The features and advantages of the present invention are illustrated by way of example in the drawings, in which:

FIGS. 7A and 7B show an overview of a random access memory (RAM) architecture employing a fourth embodiment of the present address scheme, wherein FIG. 7A shows components useful for conducting one or more read operations, and FIG. 7B shows components useful for conducting one or more write operations.

Figure 1:
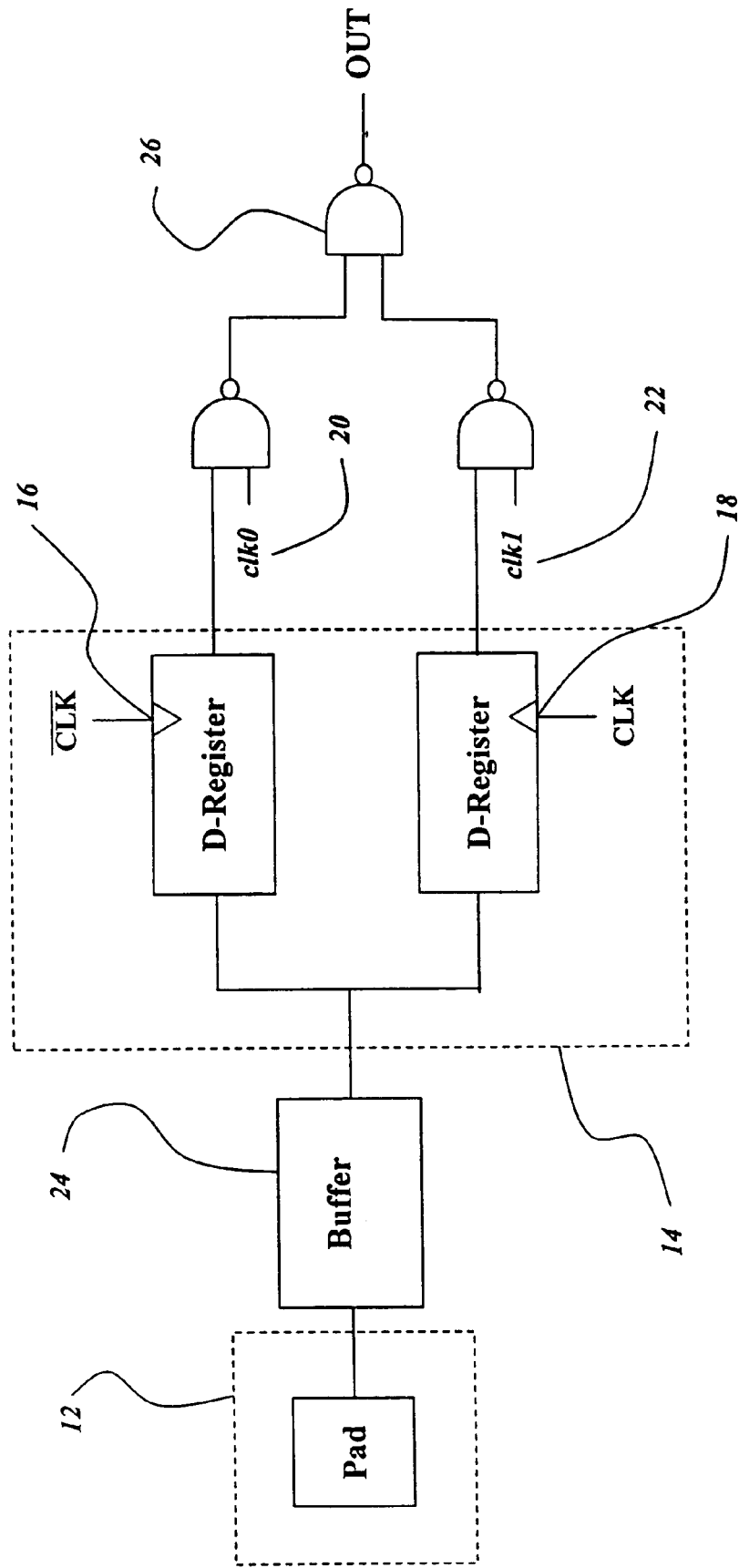
FIG. 1 shows an overview of an embodiment of the present address scheme.

It is to be understood that, in some instances, various aspects of the invention may be shown exaggerated or enlarged to facilitate an understanding of the invention, and in other instances, some aspects of the invention considered to be conventional may not be shown so as to avoid obfuscating more important aspects or features of the invention.

DETAILED DESCRIPTION OF THE PREFERRED EMBODIMENTS

Detailed descriptions of the preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

In the present random access memory, each of the address bus, address register, data input bus, data output bus, and random access memory array may independently be n or m·n bits wide, where n is an integer ≧2, preferably ≧4, and more preferably ≧8, and m is independently an integer ≧2, preferably of 2–8, and more preferably of 2–4. In specific examples, n may be 8, 9, 16, 18, 32, 36, 64, 72, 128 or 144. The data input bus may receive data from an external source. In a preferred embodiment, each of the data input bus, data output bus, and address bus is unidirectional (i.e., data flows in one direction only).

In the present invention, a "periodic signal" refers to any signal that has an oscillating waveform, the frequency of which may be predicted and/or controlled in accordance with techniques known in the art, and that can be configured to control one or more circuit functions performed as part of a read operation or a write operation in a memory. The periodic signal may be configured to control one or more data transfer operations to or from a random access memory array in response to first and second transitions thereof, respectively, where the second transition occurs within the same periodic signal cycle as, and which may be complementary to, the first transition. Therefore, the memory may operate in a synchronous manner. For synchronous operations, the periodic signal may be an internal or external clock signal, or a periodic control signal such as write enable or output enable. There may be more than one independent periodic signal controlling read, write, register and/or data pass gate functions (e.g., a clock signal and its complement). Where appropriate and/or desirable, the periodic signals comprise a first clock signal and its complement. Alternatively, however, the periodic signal may comprise a pulse generated in response to a clock transition or, alternatively, a predetermined logic or voltage level of a clock signal.

Accesses to and from the memory array, including transmission of address information along an address path to the array, may be controlled by a single input clock or a pair of differential input clocks (CLK/CLK*, where a signal designated "X*" indicates the complement of the corresponding signal "X", similar to the signals in the Figures bearing an overstrike or "bar" designation). In the present application, a "complementary transition" may refer to either the same transition of complementary signals (e.g., the rising edges of both CLK and CLK*), or opposite transitions of the same signal (i.e., the rising and falling edges of CLK). All synchronous timing may be referenced from the cross point of the differential input clock signals. Accesses can be initiated on any edge of any periodic signal (preferably on the rising edge of a clock signal, assuming any other control signals are asserted at their active logic levels), but for ease and simplicity of logic circuitry, accesses to the array are initiated on the rising edge of the positive clock (CLK).

The present random access memory array may be configured to store and/or retrieve data at any random address therein. The address is defined by one or more signals on the address bus.

One (or More) Address Busses

As shown in FIG. 1, the present invention concerns a circuit comprising an address bus 12 providing random addresses for a random access memory (RAM), and a register 14 configured to store or receive (i) a first random address from the address bus in response to a first periodic signal transition 16 and (ii) a second random address from the address bus in response to a second periodic signal transition 18, wherein the second periodic signal transition occurs within the same periodic signal cycle as, and preferably is complementary to, the first periodic signal transition. The register may be further configured to transfer or output (i) the first random address to circuitry downstream from the register in the address path of the memory (e.g., a RAM array) in response to a first control signal 20 and (ii) the second random address in response to a second, independent control signal 22.

As shown in FIG. 1, the register may comprise two registers (each of which may independently comprise a D-type register, a T-type register, a master-slave register or a latch, but which preferably comprise a master-slave register or a D-type register) configured to store random address information from the address bus in response to the two complementary periodic signal transitions 16 and 18. Each register may independently further comprise a logic gate 26 configured to output or provide the random address information (or the complement thereof) from the register in response to a periodic signal or pulse 20 or 22. The periodic signals or pulses 20 and 22 may be independently the same as or different from (i) each other and/or (ii) the periodic signal(s) 16 and/or 18.

Where the circuit employs two registers, the circuit may further comprise a logic gate 26 configured to provide random address information or its complement (e.g., OUT) from the logic gates receiving the address information stored in the registers. Such logic gates are conventional and known to those skilled in the art, and may comprise and combination of transistors and/or logic elements providing a NAND or AND function (an "AND-type logic gate").

Figure 2:
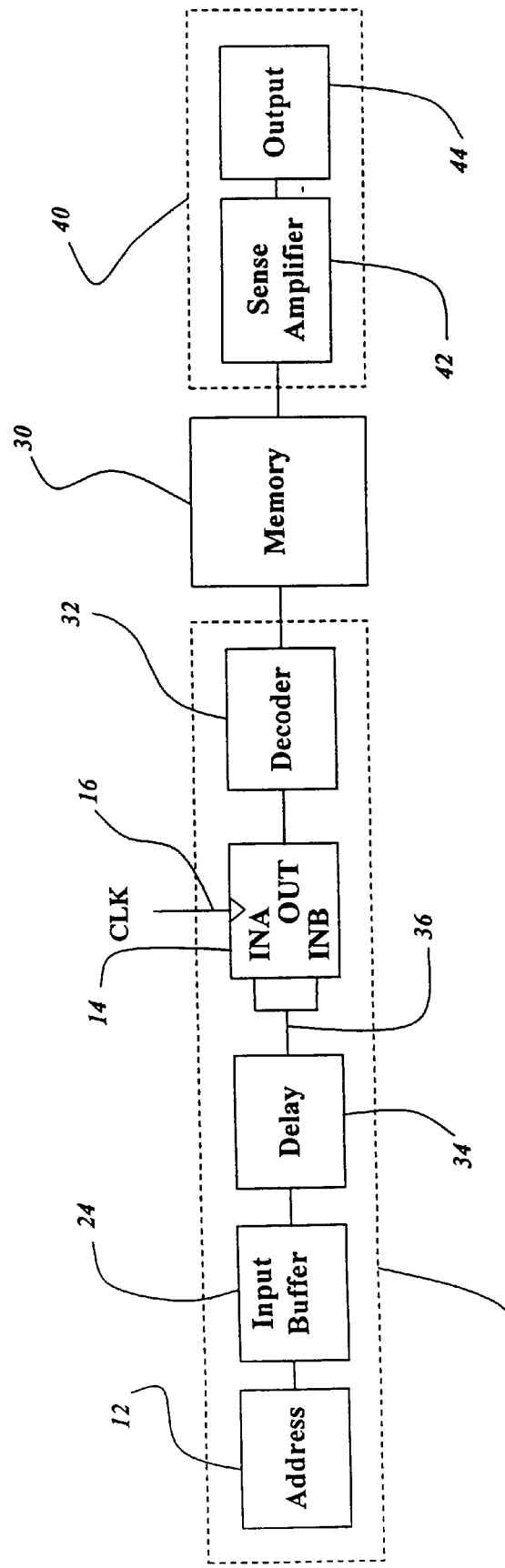
FIG. 2 shows an overview of a random access memory (RAM) architecture employing the address scheme shown in FIG. 1.

FIG. 2 shows an overview of a random access memory (RAM) architecture employing the circuit shown in FIG. 1. Thus, the present circuit may further comprise the random access memory 30 and circuitry operable to (i) read data into the random access memory array at the first random address and (ii) write data into the random access memory array at the second random address. The random access memory may further comprise a decoder 32 configured to activate the random address in the random access memory in response to receiving the random address from the register. Address input path 10 may further comprise (i) an input buffer 24 configured to receive random address information from the address bus and provide the random address information to the register, and/or (ii) a delay element 34 interposed between the input buffer 24 and register 14. Delay element 34 may be configured in accordance with techniques and circuit elements known in the art to set up and hold the address information at node 36 for a length of time sufficient to enable register 14 to store or latch the address information.

Where a decoder located downstream from the address register(s) fully decodes the address information, the length of time for which address information is set up and held (e.g., at node 36) may be minimized. This allows for greater variations in the periodic signal duty cycle. One notorious limitation to maximizing data throughput in synchronous RAMs is the length of time one must allow for variability in the periodic signal duty cycle, a parameter that effectively limits the maximum frequency of conventional clock circuits. In the present invention, practical limits to the data throughput rate may be determined by the set up and hold window (e.g., $[t_S+t_H]$; see, for example, the CLK waveform in FIG. 4) and the pulse widths of the control pulses that latch address information and/or data into a register in the corresponding input or output path (e.g., clk0, clk1; see FIGS. 3, 4, 7A and 7B).

The width of a control pulse in the present invention may be, for example, from (1/p) to (1−[1/p]) times the width of a half-cycle of the periodic signal (where p is, for example, from 1.1 to 10, preferably from 1.5 to 4). In the example shown in the waveforms inset into FIGS. 7A and 7B, p is about 2. The set up and hold window in the present invention may be, for example, about [(1/q)+(1/r)] times the width of a half-cycle of the periodic signal, where q is, for example, from 0.5 to 10, preferably from 0.75 to 4, and r is independently from 1 to 20, preferably from 1.5 to 10). In the example shown in FIG. 4, q is 1 and r is 4.

The circuitry operable to write data into the array at a random address may do so in response to at least one transition of the periodic signal. Similarly, the present random access memory may further comprise circuitry operable to read data from a random address in the array may do so in response to at least one transition of the periodic signal. The periodic signal transitions to which the read circuitry and write circuitry respond are preferably, but not necessarily, complementary to each other. For example, when the memory comprises dedicated and/or independent data input and data output ports (see the copending provisional applications identified as Attorney Docket No. CD98022 and/or Attorney Docket No. CD98023), each transition of the periodic signal may be independently designated as a read operation or a write operation. In fact, when the memory comprises two or more independent address registers (and the data busses, data registers and memory array all have the same width), each transition of the periodic signal may be independently designated as a read operation, a write operation or both read and write operations.

The random access memory may further comprise an output path 40, which may comprise one or more sense amplifiers 42 and one or more data outputs 44. Each data output 44 may comprise a data bus and an output pad. The output data bus may be unidirectional.

Figure 3:
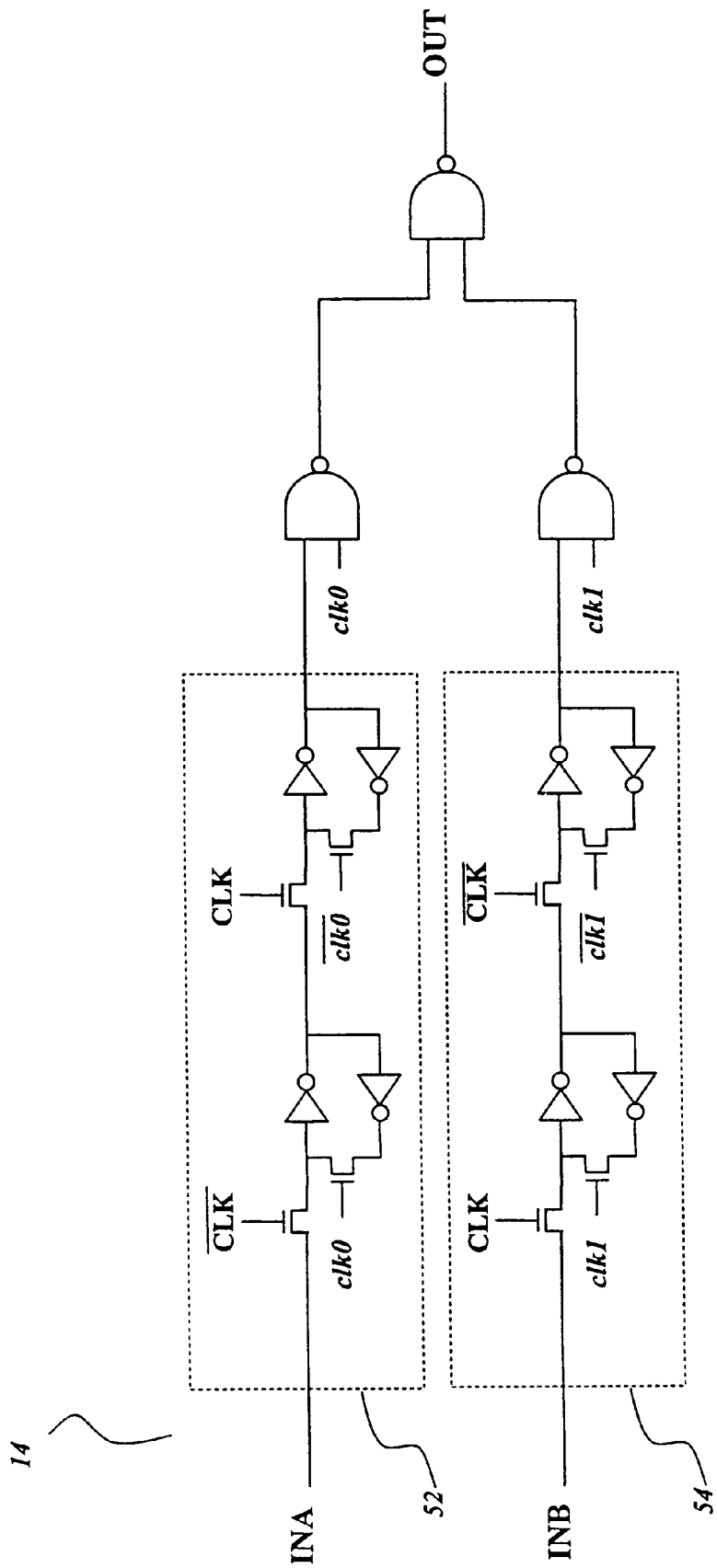
FIG. 3 shows a detailed schematic diagram of the address register shown in FIG. 1.

Referring now to FIG. 3, an exemplary address register operable in the circuits of FIGS. 1 and 2 is shown. The register may comprise two or more subregisters 52 and 54, each of which may be a D-type or master-slave-type register. The address bus provides random address information one or more inputs to register 14 (e.g., INA and INB). Address information may be received by and/or pass into subregisters 52 and 54 in response to first and second periodic signal transitions, respectively (e.g., CLK* and CLK). As shown in FIG. 3, the first and second periodic signal transitions may be complementary to each other.

Subregister 52 stores the random address information in response to a first periodic signal transition or pulse (e.g., CLK0) and outputs the random address information in response to a second periodic signal transition or pulse (e.g., CLK0*). As shown in FIG. 3, the periodic signal transitions or pulses that result in storing and outputting the random address information may be complementary to each other. When pulse generated in response to a rising or falling edge of a periodic signal such as a clock (see, e.g., clk0 and/or clk1 in FIG. 4) controls receive, store, latch and/or output functions in a register, the receive, store, latch and/or output function may be considered to be at least indirectly responsive to a periodic signal transition. Subregister 54 operates in a manner similar to subregister 52, but in response to different periodic signal transitions or pulses (e.g., CLK1 and CLK1*).

In one embodiment, the register stores two read addresses or two write addresses in a single cycle of the periodic signal (e.g., CLK). For example, register 14 stores the first random read address from the address bus in response to a first control pulse (e.g., CLK0) and the second random read address from the address bus in response to a second control pulse (e.g., CLK1). The control pulses may be generated in response to successive transitions of the periodic signal and/or its complement, such that the control pulses are in effect generated in response to complementary transitions of the periodic signal in a single cycle (see also waveforms CLK, clk0 and clk1 in FIG. 4).

Thus, the present circuit may further comprise a pulse generator configured to generate a first pulse in response to at least one of the first and second transitions of the periodic signal, the first pulse latching at least one of the random addresses into the register. The pulse generator may be further configured to generate a second pulse in response to at least one of the first and second transitions of the same or different periodic signal, the pulse latching at least a second one of the random addresses into the register.

Multiple Registers

In a further embodiment, the present circuit may comprise three or more registers. In such a case, the periodic signal and/or pulse generating logic may further comprise circuitry to provide multiple periodic signals and/or pulses, each offset from the other by a predetermined phase delay in accordance with known techniques and circuits. For example, in an embodiment comprising four registers, conventional phase delay circuitry can generate a second periodic signal phase-offset from the first clock by 90° or t/4 ns, where t is the length of the clock cycle in nanoseconds. Additional control pulses (e.g., clk2 and clk3) can be generated from the edges or transitions of this second, phase-offset clock to control third and fourth address registers in the manner described above. Periodic signals complementary to the second, phase-offset clock and its corresponding control pulses can control other functions in the third and fourth registers, and elsewhere in the RAM for circuitry associated with the third and fourth registers, in a manner similar to that described both above for first and second registers and herein below for associated circuitry.

Transferring Data To and From the Array (Reading and Writing)

Figure 4:
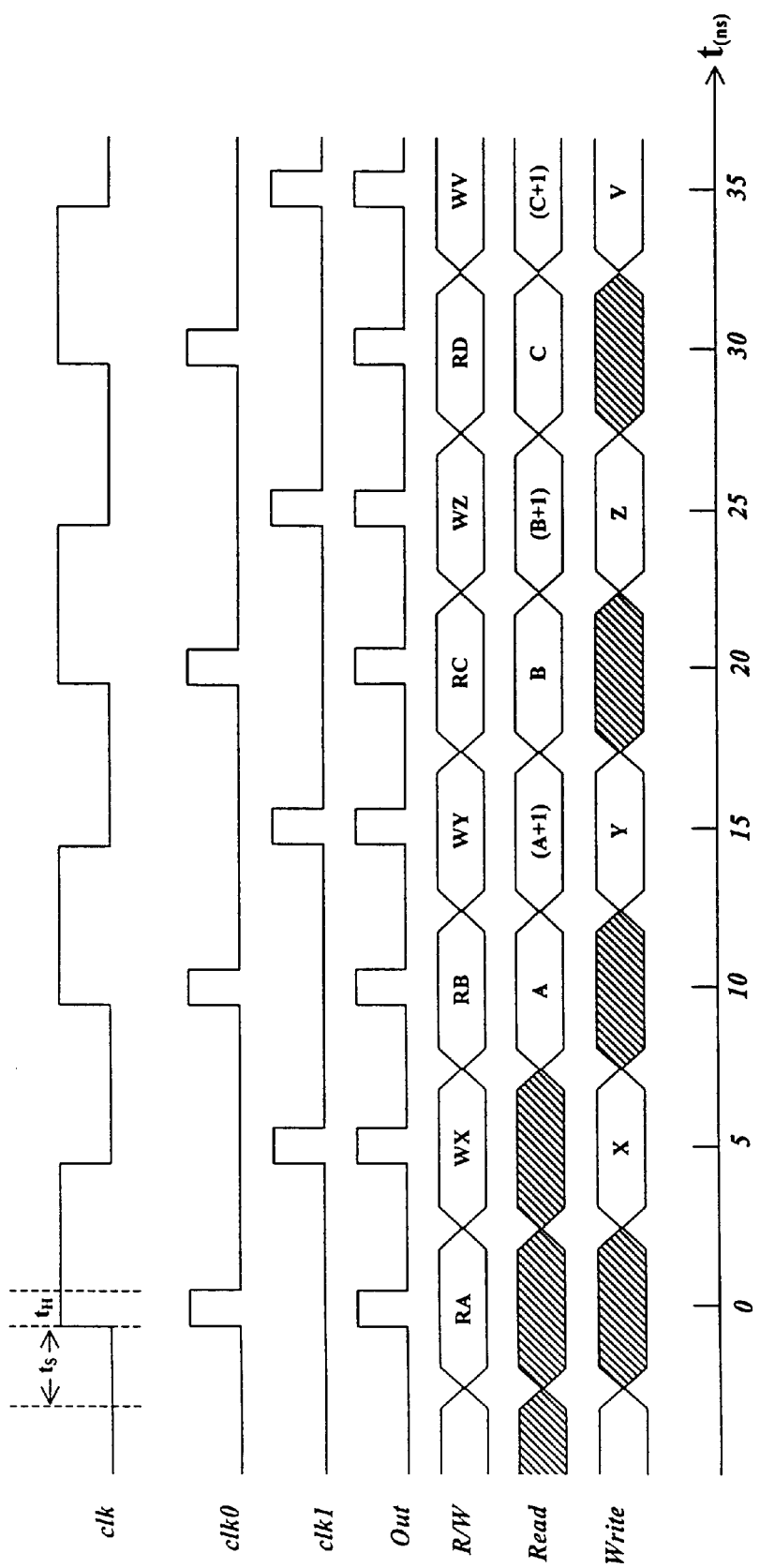
FIG. 4 shows various waveforms illustrating the relative timing of various signals in conjunction with exemplary read and/or write operations performed according to the invention.

FIG. 4 shows the sequence of data transfer events occurring during read and write operations. In FIG. 4, the letters "A", "B", "C", etc., refer to addresses in the RAM array and the corresponding word or words to be written to or read from such addresses. The terms "RA", "RB", etc., refer to a read function at address A, B, etc. The terms "WX", "WY", etc., refer to a write function at address X, Y, etc. The terms "clk0" and "clk1" refer, for example, to the control pulses that latch address information in address register 14 as shown in FIG. 3. the signal "OUT" refers to the output signal from the address register(s) and associated logic circuitry (if present) shown, for example, in FIGS. 1–3. The term "R/W" refers to read or write address information that may be stored in the address register(s) shown, for example, in FIGS. 1–3. Although the clock pulse CLK shown in FIG. 4 is a 125 MHz clock with a cycle time of 4 ns, a clock of any frequency (e.g., from 10 kHz to 10 GHz, preferably from 200 kHz to 4 GHz, more preferably from 1 MHz to 1 GHz) may be used. Examples of suitable clock frequencies include 12.5 MHz, 20 MHz, 25 MHz, 33 MHz, 50 MHz, 66 MHz, 75 MHz, 83 MHz, 100 MHz, 125 MHz, 133 MHz, 150 MHz, 166 MHz, 183 MHz, 200 MHz, 250 MHz, 333 MHz, etc.

Referring now to FIG. 4, at time t=0 ns, address A is latched or written into the address register from the address bus by pulse clk0. As described above, pulse clk0 may be generated from the positive clock CLK transition from LOW to HIGH. Address A is present on the address bus at a time about $t_S$ ns before the rising CLK transition. This is commonly known in the art as the "setup time". Address A is maintained on the address bus for a period of time of about $(t_S+t_H)$ ns (the "setup and hold time"; see, e.g., waveform CLK in FIG. 4). For a read operation, a read port select signal (see, e.g., "RPS*" in FIG. 7A) may be asserted briefly (and preferably while the periodic signal(s) CLK and/or CLK* is/are transitioning at t=0 ns). The next rising transition of the periodic signal CLK, optionally in conjunction with a control pulse (e.g., clk0 and/or clk0*), senses the data at address A and latches the corresponding data word(s) from address A in the array through one or more (optional) latches 206 into one or more output registers (e.g., 202 and 204 in FIG. 7A).

For either two n-bit-wide data words or one 2n-bit-wide data word stored in the array but output on an n-bit-wide data output bus, the HIGH logic level of CLK resulting from this initial transition at t=0 ns enables output buffer 210 and outputs a first n-bit-wide data word from address A to the data output bus. For n-bit-wide circuitry, a complementary transition of the periodic signal (e.g., a falling CLK transition or a rising CLK* transition) may then latch a second n-bit-wide data word from output register 204 into a shadow register (e.g., register 208 in FIG. 7A). The LOW logic level of CLK resulting from this complementary transition enables output buffer 212 and outputs the second n-bit-wide data word (e.g., "(A+1)", "(B+1)", "(C+1)", etc.) onto the data output bus and the data output pad(s).

In FIG. 4, at time t=2 ns, address X is latched or written into the address register from the address bus by pulse clk1. As described above, pulse clk1 may be generated from either (i) the negative clock CLK* transition from LOW to HIGH or (ii) the positive clock CLK transition from HIGH to LOW. Address X is also present on the address bus at a time about $t_S$ ns before the rising CLK transition. Address X is also maintained on the address bus for a period of time of about $(t_S+t_H)$ ns (the "setup and hold time"; see, e.g., waveform CLK in FIG. 4). For a write operation, a write port select signal (see, e.g., "WPS*" in FIG. 7B) may be asserted briefly (and preferably while the periodic signal(s) CLK and/or CLK* is/are transitioning at t=2 ns). This complementary transition of the periodic signal CLK/CLK*, optionally in conjunction with a control pulse (e.g., clk1 and/or clk1*), writes data stored in one or more data input registers (see, e.g., 220 and 222 in FIG. 7B) into the array at address X.

More specifically, a rising periodic signal CLK transition latches an n-bit-wide data word D(X) on the Data In bus into the first write register 220. Alternatively, for 2n-bit-wide circuitry, the rising transition of the positive periodic signal CLK latches a single 2n-bit-wide data word in a single 2n-bit-wide data input register. Similar but complementary to the read operation described immediately above, address X is latched or written into the address register from the address bus during the second, falling CLK transition from HIGH to LOW. The new address signal, or address transition from A to X, occurs at least about $t_S$ ns before the crossover of the differential external clocks CLK and CLK* (see FIGS. 4 and 7B). The falling transition of the CLK pulse, which may be sent on a clock generator-to-address register bus, enables the address register to store the X address that is on the address bus after the address transition.

Advantages

The RAM may access two data words with each read operation on the same clock edge as that which latches the read address. For example, referring to FIG. 7A, the first or lower word of data may be driven onto the output data bus on the clock logic level resulting from the single clock edge that latches the data in the corresponding output register, provided any applied output control signal (e.g., an output enable signal OE) is asserted in an enabling state (e.g., LOW). On the subsequent clock transition, the second or higher order data word may be driven onto the output data bus on the clock logic level resulting from the clock transition that latches the second data word in the shadow register 208, provided any applied output control signal remains asserted in an enabling state. In this configuration, all data may be available, for example, as soon as 5.5 or 6 ns after a clock rise (assuming a 125 MHz clock signal), thus providing a read operation with as little as one cycle of latency.

On the same transitions of the subsequent clock cycle, the next data word(s) stored in the array is/are latched in the output register(s), then driven through one or more (three-state) output buffers onto the data output bus/pads on the same clock logic levels as before. Read accesses can be initiated, for example, on every rising edge of the positive clock. Doing so will "pipeline" the data flow such that data is transferred out of the device on every rising and falling edge of the clock.

When deselected (e.g., in a multiple-RAM system configuration), the present RAM may first complete the pending read transactions. Synchronous internal circuitry may automatically three-state the outputs following the next rising edge of the positive clock. This will allow for a seamless transition between a port in the present RAM and any external device (including without limitation a second RAM according to the invention) without the insertion of wait states.

The input and output ports in the present RAM architecture (e.g., DATA OUTPUT in FIG. 7A and DATA INPUT in FIG. 7B) may operate independently of one another. One can read or write to any location in the memory array, regardless of the transaction address on the other port. Should the input and output ports access the same location on the same cycle of the periodic signal, the information presented to the data inputs may be forwarded to the data outputs (by, e.g., conventional bypass logic circuitry responsive to a control signal generated in response to an AND-type logic comparison of the read and write addresses), or alternatively, the data stored in the output register may first be output on the data output bus, then the same location written with the new data.

Two (or More) Address Busses

Figure 5:
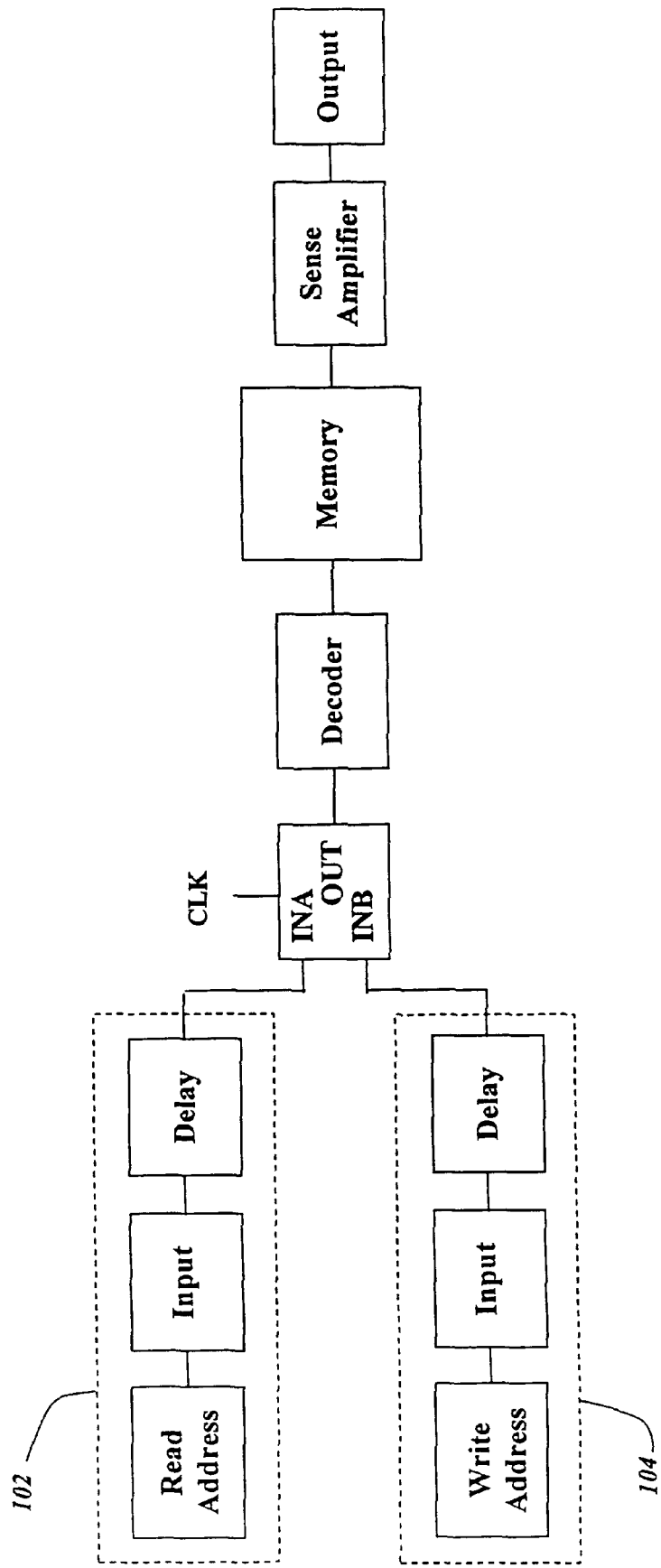
FIG. 5 shows an overview of a random access memory (RAM) architecture employing a second embodiment of the present address scheme.

In a further embodiment, the present invention may comprise first and second address input paths 102 and 104, as shown in FIG. 5. More specifically, the circuit may further comprise a second address bus providing (i) a third random address in response to a first transition of the same or different periodic signal and (ii) a fourth random address in response to a second transition of the same or different periodic signal; and a second register configured to store (i) the third random address from the second address bus in response to a third control pulse and (ii) a fourth random address from the second address bus in response to a fourth control pulse different from the third control pulse, the third and fourth control pulses being the same as or different from the first and second control pulses. Such a circuit may also further comprise a first and a second input buffer configured to receive first and second random address information from the first and second address busses, respectively, and to provide the first and second random address information to the first and second The present address bus and/or circuit may comprise a read address bus and an independent write address bus. In such a case, the register may comprise (a) a read register configured to store (i) first random read address information from the read address bus in response to a first transition of a first periodic signal and (ii) second random read address information from the read address bus in response to a second transition of the first periodic signal, and (b) a write register configured to store (i) first random write address information from the write address bus in response to a first transition of a second periodic signal and (ii) second random write address information from the write address bus in response to a second transition of the second periodic signal, the first and second periodic signals being the same or different.

Predecoding

Figure 6A:
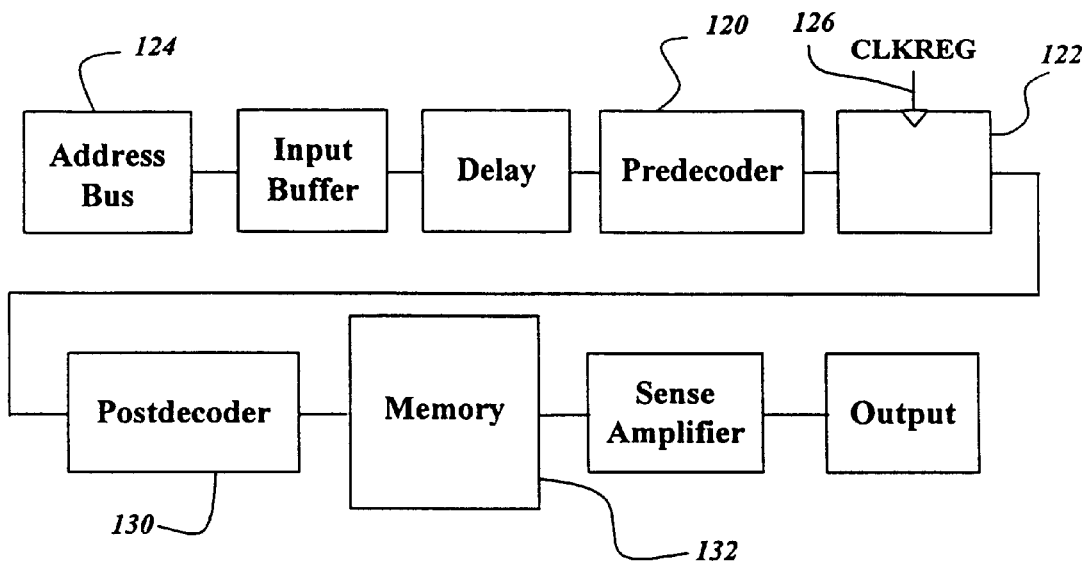
FIGS. 6A–6C show an overview of a random access memory (RAM) architecture employing a third embodiment of the present address scheme (FIG. 6A), a detailed schematic diagram of the address register shown in FIG. 6A (FIG. 6B), and an exemplary circuit configured to generate one or more pulses for latching address information in the address register shown in FIG. 6B (FIG. 6C)

In a further embodiment, as shown in FIG. 6A, the present invention may further concern a predecoder 120 configured to at least partially decode the random address information from the address bus 124 prior to storing the at least partially decoded random address information in the register 122. Consequently, the register may be configured to store (i) a first at least partially decoded random address from the address bus in response to a first periodic signal transition (e.g., at input 126) and (ii) a second at least partially decoded random address from the address bus in response to a second periodic signal transition, wherein the second transition is complementary to the first transition. The address input circuit and/or RAM may also further comprise a postdecoder 130 configured to activate the random addresses in the RAM array 132 in response to receiving the random addresses from the register.

Because some decoding is done prior to synchronously storing the address information, this embodiment may maximize the amount of time available to write data to and/or read data from the array. Maximizing the array "cycle time" (i.e., the amount of time to write data to and read data from the array) provides opportunities to increase wordline and/or bitline recovery times, thus reducing power and/or current consumption. It may also permit one to employ a larger array without requiring additional and/or more sophosticated logic circuitry, and/or to implement pulsed or self-resetting logic.

Suitable descriptions and examples of predecoder and postdecoder circuitry can be found in copending application Ser. No. 08/575,554 (entitled, "Method and Apparatus for Reducing Skew Among Input Signals Within an Integrated Circuit," filed Dec. 20, 1995) and in copending application Ser. No. 08/575,555 (entitled, "Method and Apparatus for Reducing Skew Among Input Signals and Clock Signals Within an Integrated Circuit," filed Dec. 20, 1995; abandoned in favor of continuing prosecution application Attorney Docket No. 016820.P128C, filed on Oct. 30, 1997). For example, a predecoder may decode from j to k bits of an m-bit-wide address, and the postdecoder may decode the remaining bits of the m-bit-wide address, where j, k and m are each an integer such that j<k<m, preferably such that j≧1, 2 or 3; k≦m−1, m−2, or m−3; and m is at least 4, preferably at least 8, and more preferably at least 10.

The Single Register

Figure 6B:
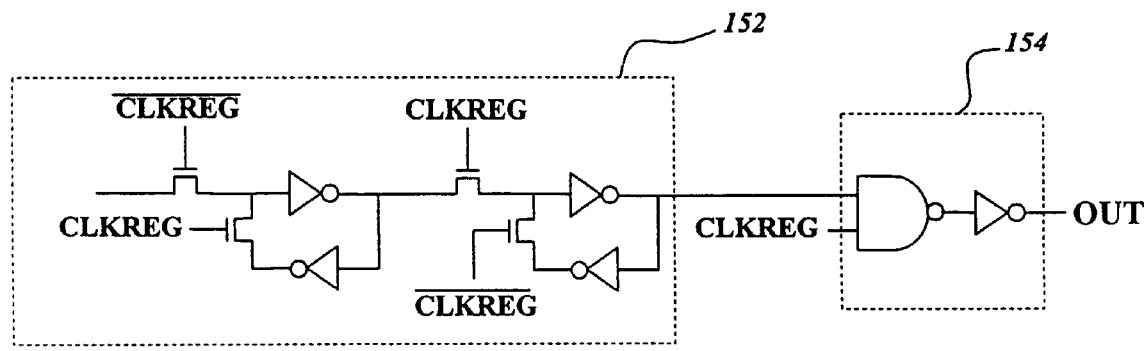
Figure 6C:
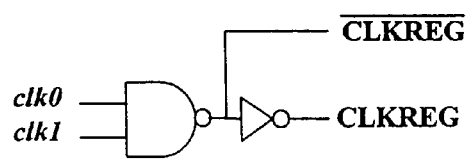

In a further embodiment, and as exemplified in FIG. 6B, the address input circuit may comprise a single register 152 (e.g., per address bit), which may replace register 14 in FIGS. 1 and 2. Optionally, to better ensure compliance with timing parameters, the register may provide an output through a sinlge logic element 154. As shown in FIG. 6C, control signals and/or pulses for latching address information in and outputting address information from the register (e.g., CLKREG and CLKREG*) may be generated from pulses generated from transitions of a periodic signal (e.g., CLK0 and CLK1; see FIGS. 3 and 4). A logic gate providing a NOR or OR function (an "OR-type logic gate") is adequate for generating control signals and/or pulses for this single-register embodiment. Consequently, register 152 operates in essentially the same manner as register 14 in FIG. 3.

The Detailed RAM Architecture

Figure 7A:
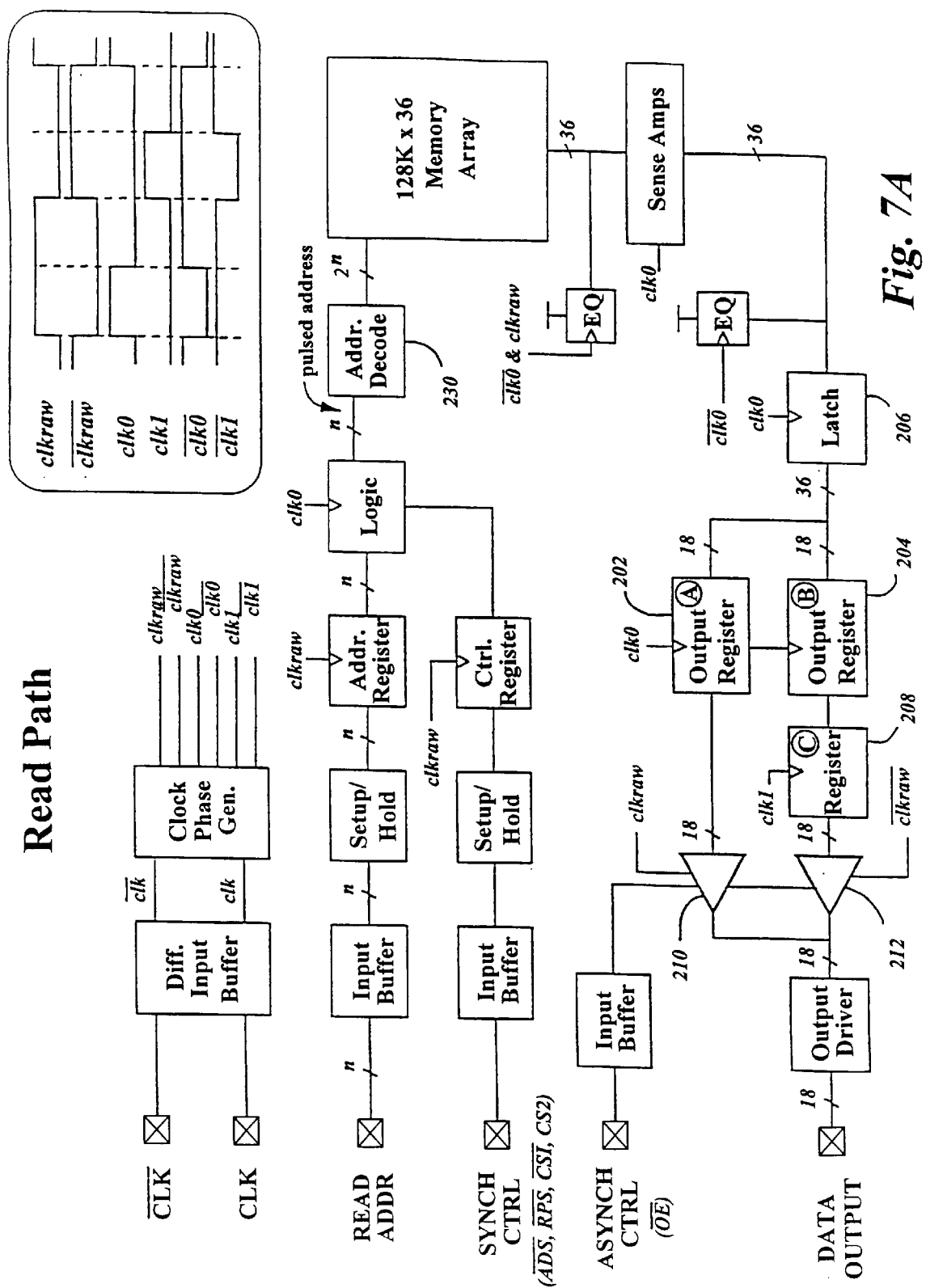
Figure 7B:
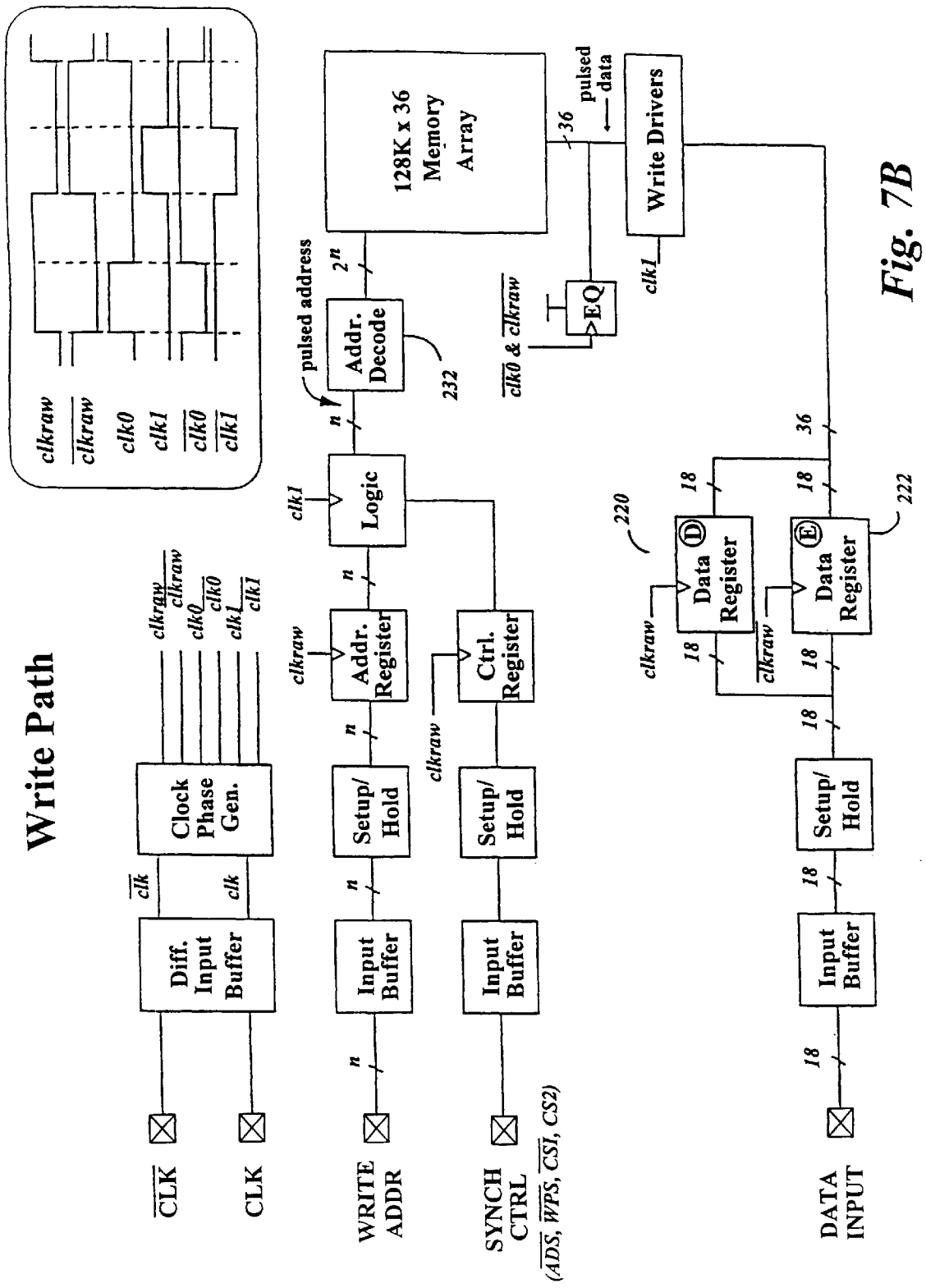

As shown in FIGS. 7A and 7B, the present random access memory (RAM) architecture may further comprise separate first and second ports (e.g., "DATA OUTPUT" [FIG. 7A] and "DATA INPUT" [FIG. 7B]) to access the memory array. The ports may be unidirectional, in which case each pair of ports (e.g., an input/output pair) may have a dedicated address bus.(e.g., "READ ADDR [FIG. 7A] and WRITE ADDR" [FIG. 7B]), in accordance with the emdominent described above for "Two (or More) Address Busses." Each data port and address path may comprise n inputs, a buffer or driver, and an n-bit register (as described above), where n is an integer of one or more, to maintain complete independence of the ports and their associated control logic. Separate data inputs and outputs eliminates the need to "turn around" the data bus as may be required with common or bidirectional I/O devices.

Accesses to the array through input and output ports may be somewhat independent of one another and are initiated synchronously with one or more periodic signals (e.g., an internal or external clock signal; a set of differential input clocks; etc.). In order to maximize data throughput, the input port transfers data on one of the rising or falling edges or during one of the sustained logic levels of the periodic signal cycle(s), and the output port transfers data on the other of the rising or falling edges or sustained logic levels of the periodic signal cycle(s). As described herein, data transfer may also be logic level-triggered; i.e., it may occur in response to a particular or predetermined logic level of one or more periodic signal(s).

The depth of the memory array may be, in effect, expanded with two or more arrays and/or independent RAM devices (e.g., integrated circuit chips), and their associated select logic circuitry. The control signals carried by such logic circuitry (e.g., port select inputs) allow each port to operate as if it was an independent device, thereby further allowing depth expansion independently on each port.

All synchronous data inputs may be passed through one or more write registers (or input registers) controlled by the periodic signal(s). All data outputs may be passed through one or more read registers (and/or output registers), also controlled by the same or different periodic signal(s).

All writes may be conducted with on-chip synchronous self-timed write circuitry to simplify the interface logic.

Example(s)

As shown in FIGS. 7A and 7B, the present RAM architecture is, in a preferred embodiment, configured as a synchronous pipelined burst static RAM (SRAM). Data may flow unidirectionally into the SRAM through the Data In bus, and/or unidirectionally out through the Data Out bus. Each bus may have its own pads for receiving or transmitting external signals. The present RAM array receives address information on a read address bus or a write address bus and may store or latch the address information in an address register. By separating the data input and data output ports, the present RAM avoids possible data contention and/or eliminates any need to "turn-around" the data bus.

All data inputs may pass through one or more n- or 2n-bit-wide input registers (e.g., n-bit-wide registers 220 and 222 as shown in FIG. 7B), controlled by the rising or falling edge of a positive input clock (e.g., clkraw, generated from the crossover of differential input clocks CLK and CLK*). In the 2n-bit-wide input register case, the data input bus may have the same width as the input register(s).

The present random access memory may comprise one or more arrays (e.g., "128K×36") configured to store and/or retrieve data at a random read and/or write address therein. The arrays are generally oriented in rows and columns, where the nuimber of rows may be from 1 to $2^x+c$, preferably from 4 to $2^x+c$, and more preferably from 16 to $2^x+c$, where x may be an integer of from 2 to 15, preferably from 3 to 14, and more preferably from 4 to 12, and c represents the number of redundant rows, which may be an integer of from 0 to 12, preferably from 0 to 8, and more preferably from 0 to ($2^x/8$), and the number of columns may independently be from 1 to $2^y+d$, preferably from 4 to $2^y+d$, and more preferably from 8 to $2^y+d$, where y may be an integer of from 0 to 10, preferably from 2 to 9, and more preferably from 3 to 8, and d represents the number of redundant columns, which may be an integer of from 0 to 8, preferably from 0 to 4, and more preferably from 0 to ($2^y/8$).

The address is defined by n signals on the address bus, where n is an integer of one or more, preferably 3 or more and more preferably of from 5 to $2^y+d$, where y and d are as defined above. Address information reaches the array from the address register through an address decoder 230 (FIG. 7A) or 232 (FIG. 7B), the signals from which identify the location(s) in the array where an operation is to be performed. The array, which may be n or m·n bits wide, preferably has the same total width as the total width of the input register(s) and/or the data input bus.

The present random access memory may further comprise an output data register, which may also be n or m·n bits wide, and may have the same width as the total width of the input register(s), the array, and/or the data input bus. Preferably, the data output bus is also n or m·n bits wide, more preferably the same width as the data input bus, the input register(s), the array, and/or the output register(s). The output port (e.g., DATA OUTPUT" in FIG. 7A) may further comprise a plurality of pads for providing the data externally.

When the random access memory comprises a plurality of arrays, the first random access memory array may receive data from a first data input bus and/or write data register, and the second random access memory array may receive data from a second data input bus and/or write data register. Similarly, a random access memory comprising a plurality of arrays may further comprise a plurality of data output busses and/or read data registers, the first and second read data registers respectively storing data transferred from the first and second random access memory arrays, and the first and second data output busses respectively transmitting data from the first and second random access memory arrays or read data registers. In this case, each random access memory array may further comprise (a) first circuitry operable to write data to the random access memory array(s) at a first random address and (b) second circuitry operable to read data from the random access memory array(s) at a second random address, each in response to successive transitions or logic levels of a periodic signal, the second random address being the same as or different from the first random address. Each array may also have a unique address bus for providing both read and write address information.

As shown in FIG. 7A, the present random access memory may further comprise an n-bits-wide data output bus, first and second (three-state) output buffers (e.g., buffers 210 and 212), and first, second and third n-bits-wide output registers (e.g., 202, 204 and 208), wherein:

each of the first and second output registers store data from the output register in response to a first periodic signal transition or level, the third output register stores data from the first output register in response to a second, complementary periodic signal transition or level, the first output buffer is enabled to provide data to the output data bus from the third output register by a third periodic signal transition or level (which may be [i] the same as or different from the second, complementary periodic signal transition or level, or [ii] a complement of the first periodic signal transition or level, and which preferably enables data output when in a particular or predetermined logic level or state), and the second output buffer is enabled to provide data to the output data bus from the second output register in response to a fourth periodic signal transition or level (which may be [i] the same as or different from the first periodic signal transition or level or [ii] a complement of the second periodic signal transition or level, and which also preferably enables data output when in a particular or predetermined logic level or state).

Control inputs (e.g., "SYNCH CTRL" and "ASYNCH CTRL" in FIG. 7A, "SYNCH CTRL" in FIG. 7B) may comprise one or more synchronous or synchronous external control signals. Such control signals may include one or more data input or write port select signals WPS or WPS*, one or more data output or read port select signals RPS or RPS*, a conventional asynchronous output enable signal (see OE* in FIG. 7A), one or more conventional chip select signals (for multiple RAM applications; see, e.g., CS1* and/or CS2 in FIGS. 7A and 7B), one or more address strobe or validity signals (e.g., "ADS*" in FIGS. 7A and 7B), etc. Synchronous external control signals may pass along the same or similar input path as address information, including passing through a control input register controlled by an edge or logic level of a periodic signal (e.g., clkraw).

One may advantageously employ multiple port select signals (e.g., WPS1, WPS2, WPS1*, WPS2*, RPS1, RPS2, RPS1*, RPS2*, etc.) when one includes multiple random access memories in a given application (e.g., a data, voice and/or video communications device, such as a network switch or router). Preferably, each RAM in a given multiple-RAM application has at least one unique combination of read and at write port select signals that activate the particular port (e.g., WPS1* and WPS2, WPS1 and WPS2*, RPS1* and RPS2, RPS1 and RPS2*, etc.). Alternatively, the different input and/or output port select signals can select (enable or disable) one read or write register of a multiple-register configuration.

The RAM shown in FIGS. 7A and 7B may further comprise one or more conventional logic circuits configured to control and/or gate the passage of address information to an address (post)decoder in response to a periodic signal and/or control pulse (e.g., clk0 [see FIG. 7A] or clk1 [see FIG. 7B]); one or more sense amplifiers interposed between the memory array and the output latch and/or output register (s); conventional sense line equalization circuitry, which may equalize one or more 2n-bit-wide busses, and which may respond to one or more periodic signals and/or control pulses (e.g., clkraw and/or clk0*; see FIG. 7A); one or more n- or 2n-bit-wide output latches which may latch output data is response to one or more periodic signals and/or control pulses (e.g., clk0; see FIG. 7A), which in turn may be the same as or different from the periodic signals and/or control pulses that latch output data into the output register(s); one or more write drivers interposed between the data input register(s) and the memory array, which may be configured to write data into the array in response to a periodic signal and/or control pulse (e.g., clk1 [see FIG. 7B]); conventional bitline equalization circuitry, which may equalize a predetermined number of bitlines and which may respond to one or more periodic signals and/or control pulses (e.g., clkraw* and/or clk1*; see FIG. 7B); one or more differential clock input buffers and one or more clock phase generators to generate the periodic signal(s) and/or control pulse(s) from the signal(s) output from the differential clock input buffer (s).

While the invention has been described in connection with certain preferred embodiments, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. A circuit comprising:
   an address bus providing random addresses for a random access memory array; and
   a register configured to store (i) a first random address from the address bus directly or indirectly in response to a first periodic signal transition and (ii) a second random address from the address bus directly or indirectly in response to a second periodic signal transition, wherein the first and second periodic signal transitions occur within a single periodic signal cycle and are complementary transitions of a single periodic signal or are similar transitions of complementary periodic signals.

2. A circuit as claimed in claim 1 wherein said second periodic signal transition is complementary to said first periodic signal transition.

3. A circuit as claimed in claim 1 wherein said periodic signal comprises a member selected from the group consisting of (a) a clock signal and (b) a pulse generated in response to a clock signal transition.

4. A circuit as claimed in claim 1 further comprising:
   said random access memory; and
   circuitry operable to (i) read data into said random access memory array at said first random address and (ii) write data into said random access memory array at said second random address.

5. A circuit as claimed in claim 4 wherein said address bus comprises a read address bus, said circuit further comprises an independent write address bus, and said register comprises:
   a read register configured to store (i) first random read address information from said read address bus in response to a first transition of a first periodic signal and (ii) second random read address information from said read address bus in response to a second transition of said first periodic signal; and
   a write register configured to store (i) first random write address information from said write address bus in response to a first transition of a second periodic signal and (ii) second random write address information from said write address bus in response to a second transition of said second periodic signal, said first and second periodic signals being the same or different.

6. A circuit as claimed in claim 1 wherein said address bus provides a first random address to said register during one of said first and second periodic signal transitions, and said circuit further comprises a second address bus providing a second random address to said register during the remaining one of said first and second periodic signal transitions.

7. A circuit as claimed in claim 6 further comprising:
   a first input buffer configured to receive first random address information from said first address bus and provide said first random address information to said register; and
   a second input buffer configured to receive second random address information from said second address bus and provide said second random address information to said register.

8. A circuit as claimed in claim 7 further comprising
   a second register configured to store said second random address information directly or indirectly in response to third and fourth periodic signal transitions, wherein the third and fourth periodic signal transitions occur within said single periodic signal cycle and are the same as or different from said second and first periodic signal transitions, respectively.

9. A circuit as claimed in claim 8 wherein:
   said first register further comprises a first logic gate configured to provide said first random address information or its complement from said first register in response to a second periodic signal; and
   said second register further comprises a second logic gate configured to provide said second random address information or its complement from said second register in response to a third periodic signal,
   said second and third periodic signals being independently the same as or different from (i) each other and/or (ii) said first periodic signal.

10. A circuit as claimed in claim 9 wherein said second periodic signal transition is a first pulse signal generated in response to said first periodic signal transition, and said third periodic signal is a second pulse signal generated in response to a transition complementary to said first periodic signal transition.

11. A circuit as claimed in claim 1 wherein:
   said address bus provides (i) a first random read address in response to said first periodic signal transition and (ii) a second random read address in response to said second periodic signal transition;
   said register stores (i) said first random read address from said address bus in response to a first control pulse and (ii) said second random read address from said address bus in response to a second control pulse different from said first control pulse; and said circuit further comprises:

a second address bus providing (i) a first random write address in response to said first periodic signal transition and (ii) a second random write address in response to said second periodic signal transition; and a second register configured to store (i) said first random write address from said second address bus in response to a third control pulse and (ii) a second random write address from said second address bus in response to a fourth control pulse different from said third control pulse, said third and fourth control pulses being the same as or different from said first and second control pulses.

12. A circuit as claimed in claim 11 wherein said third and fourth control pulses are complementary to said first and second control pulses, respectively.

13. A circuit as claimed in claim 1 further comprising a logic gate configured to provide random address information or its complement from said register in response to a third periodic signal transition, said third periodic signal transition being the same as or different from said first and second periodic signal transitions.

14. A circuit as claimed in claim 13 wherein said address register comprises a master-slave type register.

15. A circuit as claimed in claim 1 further comprising a pulse generator configured to generate a first pulse in response to at least a first transition of a periodic signal, said first pulse latching at least one of said random addresses into said register.

16. A circuit as claimed in claim 15 wherein said pulse generator is further configured to generate a second pulse in response to at least a second transition of said periodic signal, said pulse latching at least a second one of said random addresses into said register.

17. A circuit as claimed in claim 1 further comprising an input buffer configured to receive random address information from said address bus and provide said random address information to said register.

18. A random access memory, comprising the circuit as claimed in claim 1; and a decoder configured to activate said random address in said random access memory in response to receiving said random address from said circuit.

19. A circuit as claimed in claim 1 wherein said register is further configured to transfer (i) said first random address to said random access memory array in response to a first control signal and (ii) said second random address to said random access memory array in response to a second, independent control signal.

20. A circuit as claimed in claim 1 wherein said register is further configured to transfer said first and second random address from the address bus to said random access memory array within a single periodic signal cycle.

21. A random access memory, comprising an address bus providing random address information for a random access memory array;

a predecoder configured to at least partially decode said random address information from said address bus;

a register configured to store (i) a first at least partially decoded random address from said address bus in response to a first periodic signal transition and (ii) a second at least partially decoded random address from said address bus in response to a second periodic signal transition, wherein said first and second periodic signal transitions occur within a single periodic signal cycle; and a postdecoder configured to activate said random addresses in said random access memory in response to receiving said random addresses from said register.

22. A random access memory as claimed in claim 21 wherein said second periodic signal transition is complementary to said first periodic signal transition.

* * * * *